(12) United States Patent
Marienborg et al.

(10) Patent No.: US 8,290,113 B2
(45) Date of Patent: Oct. 16, 2012

(54) FREQUENCY SYNTHESIZER PRESCALER SCRAMBLING

(75) Inventors: Jan-Tore Marienborg, Olso (NO); Per Torstein Røine, Olso (NO)

(73) Assignee: Texas Instruments Incorporated, Dallas, TX (US)

(*) Notice: Subject to any disclaimer, the term of this patent is extended or adjusted under 35 U.S.C. 154(b) by 28 days.

(21) Appl. No.: 13/051,588

(22) Filed: Mar. 18, 2011

(65) Prior Publication Data

US 2012/0235714 A1 Sep. 20, 2012

(51) Int. Cl.
*H03K 21/00* (2006.01)

(52) U.S. Cl. .......................... 377/47; 377/48

(58) Field of Classification Search .................. None
See application file for complete search history.

(56) References Cited

U.S. PATENT DOCUMENTS

| | | | |
|---|---|---|---|
| 7,167,685 B2* | 1/2007 | Kakerow et al. | 455/76 |
| 7,379,522 B2* | 5/2008 | Narathong et al. | 377/47 |
| 7,564,276 B2* | 7/2009 | Narathong et al. | 327/117 |
| 2009/0213980 A1* | 8/2009 | Ding et al. | 377/48 |
| 2009/0302900 A1* | 12/2009 | Marutani | 327/117 |
| 2011/0150168 A1* | 6/2011 | Tseng et al. | 377/47 |
| 2011/0273209 A1* | 11/2011 | Lee | 327/158 |

OTHER PUBLICATIONS

Nevena Rakuljic, Tree-Structured DEM DACs with Arbitrary Numbers of Levels, IEEE Transactions on Circuits and Systems—I: Regular Papers, vol. 57, No. 2, Feb. 2010.

* cited by examiner

*Primary Examiner* — Tuan T Lam
(74) *Attorney, Agent, or Firm* — Ronald O. Neerings; Wade James Brady, III; Frederick J. Telecky, Jr.

(57) ABSTRACT

Various apparatuses, methods and systems for frequency dividing a clock signal are disclosed herein. For example, some embodiments of the present invention provide an apparatus including a plurality of multiplexers connected in series with the clock signal, each having a plurality of inputs of different phase delays. The apparatus also includes a delta sigma modulator connected to control inputs on the plurality of multiplexers. The delta sigma modulator is adapted to repeatedly select different ones of the pluralities of inputs of different phase delays in the plurality of multiplexers to change a divide ratio between the clock signal and an output of the plurality of multiplexers. The apparatus also includes a multiplexer usage accumulator connected to the delta sigma modulator to track usage of the plurality of multiplexers. The apparatus also includes a scrambler circuit connected between the delta sigma modulator and the control inputs on the plurality of multiplexers, adapted to control settings in the plurality of multiplexers based at least in part on the multiplexer usage accumulator.

20 Claims, 4 Drawing Sheets

FREQUENCY SYNTHESIZER PRESCALER SCRAMBLING

BACKGROUND

A frequency synthesizer is an electronic circuit that generates any of a range of output frequencies from an input signal typically having a single fixed frequency. Frequency synthesizers are used in a wide range of applications, such as in the transceivers of mobile phones and radios and wireless network equipment. Data to be transmitted by these devices modulates a radio frequency (RF) carrier signal in the transmitter portion of a transceiver in the transmitting device and the modulated signal is transmitted. The modulated signal is received and demodulated in the receiver portion of a transceiver in the receiving device. In order to correctly modulate and demodulate the signal, an accurate RF carrier signal must be generated in the transmitting and receiving devices. The frequency synthesizer is used to generate the RF carrier signal to be modulated by the data and demodulated to recover the data, typically based on a local oscillator that oscillates at a stable frequency. One typical type of frequency synthesizer includes a phase-locked loop (PLL) that produces an output at a frequency that is at an integer multiple of the input signal from the local oscillator. An integer-multiple PLL typically includes a phase detector (PD), voltage controlled oscillator (VCO), and a divider. The phase detector compares the input signal with a feedback signal and produces an error signal that is used to control the VCO. By connecting a divider between the output of the VCO and the feedback input of the phase detector, the phase detector attempts to keep the divided feedback signal in phase with the input signal, thereby producing an output from the VCO at an integer multiple of the input frequency. As a result, the frequency resolution of an integer-N PLL is equal to the input frequency. An integer-N PLL with a relatively high input frequency suffers from poor output frequency resolution. An integer-N PLL with a low reference frequency used to provide fine output frequency resolution suffers from a long lock time due to narrow loop bandwidth and a large divide ratio that increases in-band phase noise.

One solution to these disadvantages is the use of a fractional-N PLL, based on a fractional-N divider. In a fractional-N divider, the divider alternates between divide ratios. For example, by alternating between dividing by 5 and 6, the output frequency would be 5.5 times the input frequency. However, this can cause noise spurs at the frequency at which the divider ratio is switched. In the example above where the divider ratio is switched every period of the input signal, the noise spur would be at ½ the input frequency. The noise spur moves to an even lower frequency when the divider ratio is closer to an integer number, such as 5.01, when the divider would divide by five 99 times and by six 1 time, moving the fractional noise to $\frac{1}{100}$ of the input frequency. Low frequency noise generated by the fractional-N divider is not filtered effectively by the PLL because it is typically well below the loop bandwidth of the PLL, causing jitter on the output.

A delta sigma (Δs) modulator shifts the divider noise to higher frequencies where it can be filtered out by the PLL. The delta sigma modulator (DSM) changes or modulates the divider ratio between multiple different ratios while placing the average value at the desired divider ratio. The divider ratio is typically changed every few cycles to keep the noise spur at as high a frequency as possible so that it can be filtered by the PLL. Instead of alternating only between divider ratios of 5 and 6, the DSM may alternate between divider ratios of, for example, any integer ratio between 2 and 8, while placing the average value at the desired ratio of 5.5. By alternating frequently between a greater range of divider ratios, the noise is elevated to a higher frequency. However, a need remains for further noise reduction techniques.

BRIEF SUMMARY

Various apparatuses, methods and systems for frequency dividing a clock signal are disclosed herein. For example, some embodiments of the present invention provide an apparatus including a plurality of multiplexers connected in series with the clock signal, each having a plurality of inputs of different phase delays. The apparatus also includes a delta sigma modulator connected to control inputs on the plurality of multiplexers. The delta sigma modulator is adapted to repeatedly select different ones of the pluralities of inputs of different phase delays in the plurality of multiplexers to change a divide ratio between the clock signal and an output of the plurality of multiplexers. The apparatus also includes a multiplexer usage accumulator connected to the delta sigma modulator to track usage of the plurality of multiplexers. The apparatus also includes a scrambler circuit connected between the delta sigma modulator and the control inputs on the plurality of multiplexers, adapted to control settings in the plurality of multiplexers based at least in part on the multiplexer usage accumulator.

In some embodiments of the apparatus, the delta sigma modulator specifies a phase rotation to be applied to the clock signal by the multiplexers, and the multiplexers have a number of redundant states for at least one value for the phase rotation. The scrambler circuit may be adapted to select among the redundant states to achieve the specified phase rotation and to reduce imbalance in the state usage.

Some embodiments of the apparatus include phase multiplexer controllers connected between the delta sigma modulator and the phase multiplexers to convert the phase rotation to multiplexer input selections. Some embodiments also include a divider connected between multiplexers, which causes phase rotations in the multiplexers to be weighted differently, thereby providing redundant paths through the multiplexers for a given phase rotation.

In some embodiments of the apparatus, the delta sigma modulator is adapted to balance usage of odd and even state groups in the plurality of multiplexers. The delta sigma modulator selects an underused state group by specifying an odd value phase rotation, where the odd value phase rotation is selected to minimize the add quantization noise.

Other embodiments of the present invention provide a method for dividing a frequency of a clock signal. A phase rotation signal is generated in a delta sigma modulator to control a phase rotation in phase multiplexers in a fractional-N divider prescaler. Usage of phase multiplexer states is tracked, and a selection between redundant states is made to achieve the phase rotation corresponding to the phase rotation signal, thereby reducing imbalance in the state usage. In some embodiments, the current state of each phase multiplexer is tracked, for example by calculating the sum of the phase rotation and a previous selected multiplexer input number, modulo the number of inputs in the phase multiplexer.

Some embodiments of the method also include tracking usage of state groups in the multiplexers, and manipulating the output of a quantizer in the delta sigma modulator to reduce the imbalance in the state usage of the plurality of states, for example by changing the quantizer output from an even value to an odd value that is selected to minimize quantization noise, thereby changing the state group used in the multiplexers.

In some embodiments, the likelihood of changing the output of the quantizer is inversely proportional to the quantizer error and proportional to an imbalance in the state group usage.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components.

DETAILED DESCRIPTION

The drawings and description, in general, disclose various embodiments of a frequency synthesizer having a delta sigma modulated fractional-N frequency divider with prescaler scrambling. The fractional-N frequency divider includes a prescaler and an AM counter to apply a fractional divisor and an integer divisor, respectively, to a clock signal in the feedback loop of the frequency synthesizer. The prescaler includes a chain of multiplexers (or MUXes) that select among a number of phase shifted clock signals, applying a phase shift between the input and output of the prescaler. When the MUX inputs are continuously changed or rotated, a frequency shift is achieved between the input and output of the prescaler. The change in MUX inputs is controlled by an output value from the delta sigma modulator (DSM). The DSM determines a MUX state delta rather than a specific MUX setting, changing the phase shift in the prescaler based on the amount by which the MUX state changes. The prescaler chain is sensitive to MUX mismatch, with the mismatch causing noise that affects the overall phase noise in the frequency synthesizer. Multiple phase MUXes are provided in the prescaler with several redundant phase settings. A particular phase can be obtained by selecting any of the several redundant phase settings. The prescaler MUX states are scrambled, manipulating which of the redundant phase settings are selected for a desired phase shift to equalize usage of redundant states. This permits shaping of mismatch induced noise and averages out low frequency noise components. By scrambling to average MUX state usage, the mismatch induced noise is moved up to the cut-off region of the PLL loop-filter in the frequency synthesizer. MUX state usage is tracked to ensure proper averaging, because the DSM controls phase shift, rather than directly controlling the MUX state.

In some embodiments, there are certain DSM outputs that do not have redundant states in the phase MUXes, and the DSM may generate output values that make proper averaging difficult using only the redundant states. This may be addressed in some embodiments by tracking usage and manipulation of odd and even DSM outputs. When the DSM outputs an even value the MUX will either stay in the previous state or toggle between two states, given a MUX with a total of four possible states. If an odd state is output the MUX will jump to a different state than the previous one and over time all states will be used equally much. The DSM is therefore forced to output the nearest odd value, increasing the likelihood of resolving the state at the cost of slightly increased quantization noise. Forcing the quantizer in the DSM to output an odd value is equivalent to adding an error before the quantizer. Since the error is added in the DSM loop it will be noise shaped and thus most of the energy is moved to high frequencies that fall out-of-band.

Figure 1:
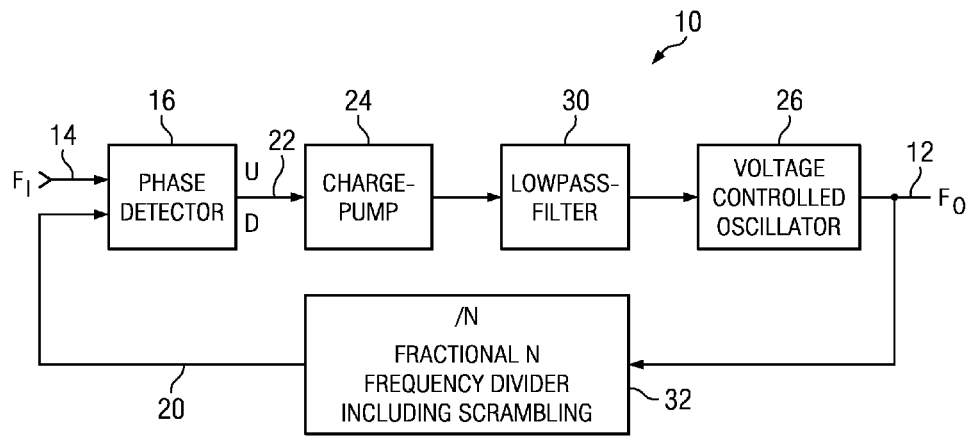
FIG. 1 depicts a block diagram of a fractional-N frequency synthesizer PLL with prescaler scrambling in a delta sigma modulated fractional-N frequency divider in accordance with some embodiments of the present invention.

Turning now to FIG. 1, an embodiment of a frequency synthesizer PLL 10 is illustrated which can generate an output signal 12 having a frequency at a fractional multiple of a frequency at the input signal 14. A phase detector 16 compares the phase of the input signal 14 with the phase of a feedback signal 20. The phase detector output 22 controls a charge pump 24 which drives a voltage controlled oscillator (VCO) 26 through a lowpass filter 30. A delta sigma modulated fractional-N divider with prescaler scrambling 32 is connected to the output signal 12, producing the feedback signal 20 as a fractional-N divided form of the output signal 12. During operation, the phase detector output 22 causes the charge pump 24 to increase the voltage to the VCO 26 if the phase of the feedback signal 20 falls behind the phase of the input signal 14, and to decrease the voltage to the VCO 26 if the phase of the feedback signal 20 advances before the phase of the input signal 14. In this way, the input signal 14 and feedback signal 20 are kept in phase at the same frequency. The frequency of the output signal 12 is therefore directly related to the frequency at the input signal 14 by the fractional N divider ratio applied by the fractional-N divider with prescaler scrambling 32.

Note that the fractional-N divider with prescaler scrambling 32 is not limited to use with a frequency synthesizer PLL 10 of the example architecture of FIG. 1, and any of a number of suitable PLL architectures or other frequency synthesizer architectures may be used with the fractional-N divider with prescaler scrambling 32.

Figure 2:
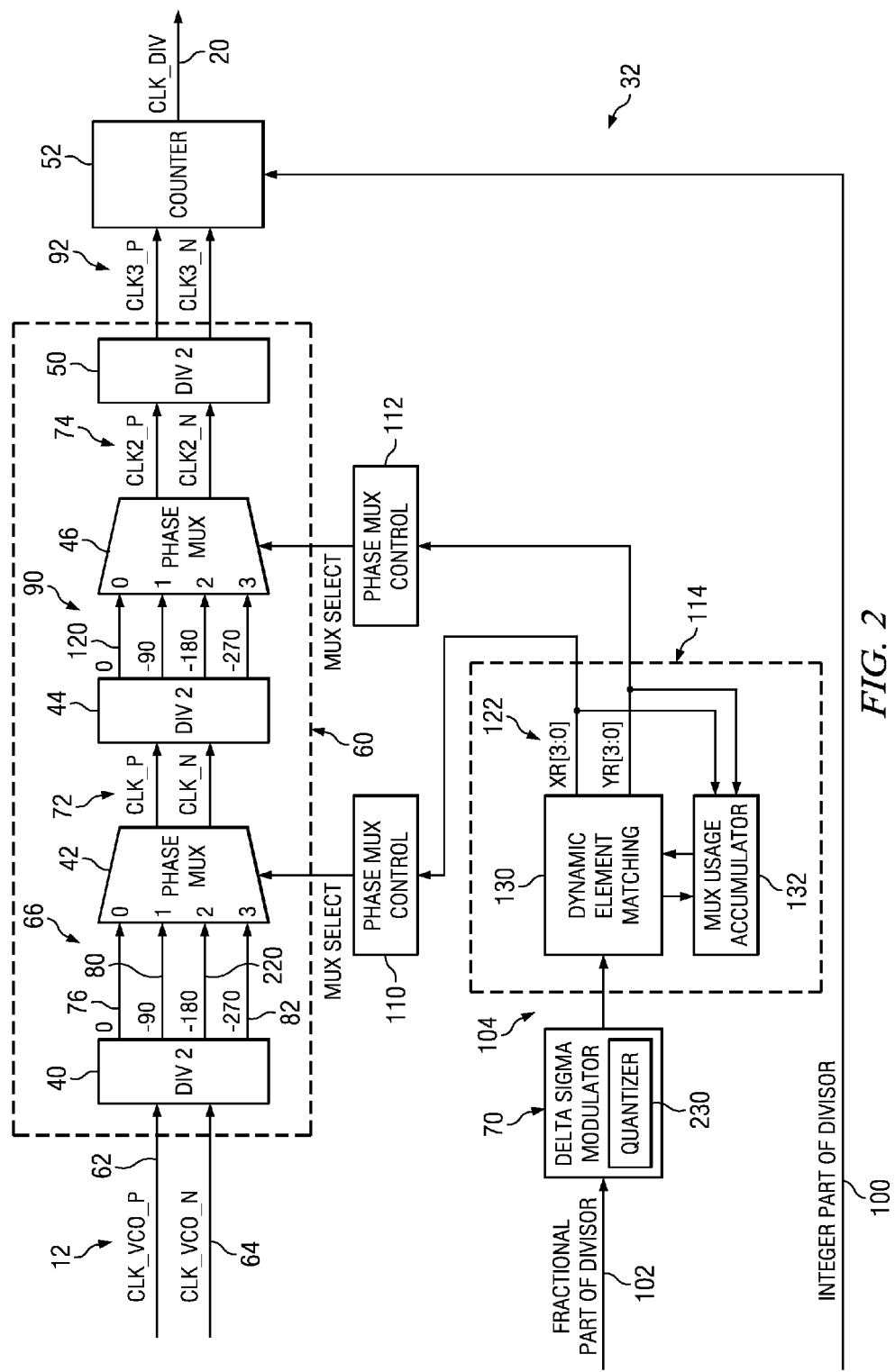
FIG. 2 depicts a block diagram of a delta sigma modulated fractional-N frequency divider with prescaler scrambling in accordance with some embodiments of the present invention.

Turning now to FIG. 2, a block diagram of an example of a fractional-N divider with prescaler scrambling 32 is illustrated. The output signal 12 from the VCO 26 is connected through a prescaler 60 or prescaler chain including a divider 40, phase MUX 42, divider 44, phase MUX 46, divider 50 and AM counter 52. The output signal 12 from the VCO 26 is provided as an input to the prescaler 60, in some embodiments having two clock phases 62 and 64 separated by 180 degrees. The divider 40 divides the output signal 12 from the VCO 26 into four phase delayed signals 66, with delays of 0, 90, 180, and 270 degrees. In the example embodiment illustrated in FIG. 2, the divider 40 divides by two, although the fractional-N divider with prescaler scrambling 32 is not limited to this example divisor. Similarly, the phase delayed signals 66 at the output of the divider 40 in the example embodiment of FIG. 2 are separated by 90 degrees, although the fractional-N divider with prescaler scrambling 32 is not limited to four outputs from the divider 40 or to a 90 degree phase separation. The dividers 40 and 44 can be implemented using any suitable circuit or device for dividing a clock by the desired amount. For example, to divide by two as in FIG. 2, the dividers 40 and 44 may comprise master/slave flip flops or latches.

Each phase MUX 42 and 46 continuously selects a different input under the control of the DSM 70, rotating through the inputs at a rate set by the DSM 70 to provide the desired divide ratio. By selecting a different input signal in the phase MUX 42 during a clock cycle, the clock cycle can be stretched or contracted, moving the edge of the signal in time. For example, if input 76 is the selected input at the beginning of a clock cycle, and input 80 is selected during the first half of the clock cycle, the first half of the clock cycle at the output 72 of the phase MUX 42 will be lengthened by a quarter clock cycle, because input 80 is delayed by 90 degrees from input 76. Conversely, if input 76 is the selected input at the beginning of a clock cycle, and input 82 is selected during the first half of the clock cycle, the first half of the clock cycle at the output 72 of the phase MUX 42 will be shortened by a quarter clock cycle, because input 82 is advanced by 90 degrees (equivalent to being delayed by 270 degrees) over input 76. While a single state change in one or more of the phase MUXes 42 and 46 only affects a single clock cycle, by continuously changing the state or selected inputs 66 and/or 90 of the phase MUXes 42 and 46 the frequency at the output 92 of the prescaler 60 can be increased or decreased. The term "rate of rotation" is used herein to refer to the rate at which phase rotations are performed by selecting successive inputs in the phase MUXes 42 and 46. Each time a single 90 degree phase rotation is performed, the next phase is selected, skipping a quarter of the period of the output 66 from the divider 40. If four rotations are performed, an entire period is skipped, dividing the frequency by two in the phase MUXes 42 and 46.

The divisor applied to the output signal 12 by the fractional-N divider with prescaler scrambling 32 is based on an integer divisor 100 and a fractional divisor 102. The AM counter 52 divides the prescaler output 92 by an amount specified by the integer divisor 100, and the prescaler 60 works in conjunction with the AM counter 52 to apply the fractional portion of the overall divisor to the output signal 12. The DSM 70 receives as input the fractional divisor 102 and generates a phase rotation signal or phase rotation control words 104 that specify the phase MUX rotations needed over time to achieve the desired division. Because the phase rotation control words 104 specify the MUX setting change or delta rather than specific MUX settings, phase MUX controllers 110 and 112 are provided between the DSM 70 and the phase MUXes 42 and 46 to convert the phase rotation control words 104 to the specific phase MUX settings or MUX input selections needed to provide the requested phase rotation.

Because the dividers 40 and 44 are not perfect dividers, and the different paths through the dividers 40 and 44 and the MUXes 42 and 46 are not of perfectly equal length or delay, there is some phase mismatch at the outputs 72 and 74 of the phase MUXes 42 and 46. If certain MUX states are used for long periods, the frequency of the phase mismatch noise may fall below the cut-off region of the PLL loop-filter in the frequency synthesizer. By scrambling the phase MUX state usage and using all the MUX states equally much, the path usage is averaged out, mitigating the effect of the MUX mismatches by moving the phase mismatch noise up into the cut-off region where it can be filtered out.

A scrambler 114 is provided between the DSM 70 and the phase MUX controllers 110 and 112 to substantially equalize the phase MUX state usage, tracking usage of each MUX state and changing the phase rotation control words 104 from the DSM 70 as needed to equalize usage of the MUX states. To enable the scrambler 114 to change the phase rotation control words 104 to equalize MUX state usage without changing the division results of the prescaler 60, redundant states are provided in the prescaler 60. In order to provide a particular range for the division ratio supported by the prescaler 60, each period in the feedback signal 20 at the output of the divider 32 is divided into a number of smaller periods or sub-periods, and each phase MUX 42 and 46 can perform one rotation in each sub-period. In one example embodiment, the output period is divided into three sub-periods, so the phase MUXes 42 and 46 can each perform three phase rotations during one output period. Because a divider 44 is placed between the phase MUXes 42 and 46 with a divisor of two, each rotation in the second phase MUX 46 has a weight of two, or results in the same phase change as two rotations in the first phase MUX 42. With three rotations per output period possible in each of the phase MUXes 42 and 46, this provides a range of 0 to 9 rotations per output period, three for the first phase MUX 42 and three for the second phase MUX 46, each of which have a weight of two, or 3+(3*2)=9 rotations. The different weight or effect of phase changes in the two phase MUXes 42 and 46 provides the redundant states that enable scrambling, because different phase MUX states can be used to apply the same divisor in the prescaler 60. Note that in other embodiments, more than two MUXes may be provided in the prescaler chain, with any suitable divisor applied between MUXes. Furthermore, the output period may be divided into any suitable fraction as well as the three sub-periods described in this example embodiment. Any of a number of possible ranges for the rate of rotation may thus be achieved.

Several examples of the phase MUX rotations will now be given to illustrate the redundancy in one embodiment of the prescaler 60. At the upper and lower ends of the rate of rotation range, there is no redundancy in some embodiments. For example, to perform 0 rotations, no phase rotations are performed on either phase MUX 42 or 46. To perform 1 rotation, a single phase rotation is performed on the first phase MUX 42 and none on the second phase MUX 46. Similarly, to perform 8 rotations, 2 phase rotations are performed on the first phase MUX 42 and 3 on the second phase MUX 46, for a total of 2+(3*2) or 8 rotations. To perform 9 rotations, 3 phase rotations are performed on the first phase MUX 42 and 3 on the second phase MUX 46. However, for phase rotations between the upper and lower ends of the range, one or more redundant states are available. For example, to perform 2 rotations, the scrambler 114 can select either 2 phase rotations on the first phase MUX 42 and 0 on the second phase MUX 46, or 0 on the first phase MUX 42 and 1 on the second phase MUX 46. This replacement of 2 phase rotations in the first phase MUX 42 with a phase rotation in the second phase MUX 46 is a redundant state in the prescaler 60.

Table 1 below gives the various MUX settings used by the prescaler 60 and scrambler 114 of FIG. 2 to achieve each number of phase rotations from 0 to 9 as selected by the DSM 70. The DSM 70 calculates the desired phase shift, while the MUX control values specify the relative MUX rotation. The DSM Output number in Table 1 gives the relative negative phase shift, thus the resulting phase shift is given as "(3−X)+ 2*(3−Y)". So when the DSM output is e.g. 4, alternative 1 would be '(3−1)+2*(3−2)=4', while alternative 2 would be "(3−3)+2*(3−1)=4". Again, the redundancy is available because phase MUX 42 is operating at twice the frequency of phase MUX 46. Thus a phase rotation in phase MUX 46 will have twice the impact of the same rotation in phase MUX 42 as the period of the signal in phase MUX 46 is twice as large as in phase MUX 42.

TABLE 1

| DSM Output | MUX 42 (X) Alt 1 | MUX 46 (Y) Alt 1 | MUX 42 (X) Alt 2 | MUX 46 (Y) Alt 2 |
|---|---|---|---|---|
| 0 | 3 | 3 | 3 | 3 |
| 1 | 2 | 3 | 2 | 3 |
| 2 | 3 | 2 | 1 | 3 |
| 3 | 2 | 2 | 0 | 3 |
| 4 | 1 | 2 | 3 | 1 |
| 5 | 0 | 2 | 2 | 1 |
| 6 | 3 | 0 | 1 | 1 |
| 7 | 2 | 0 | 0 | 1 |
| 8 | 1 | 0 | 1 | 0 |
| 9 | 0 | 0 | 0 | 0 |

Note that rotation states do not map directly to actual paths through the prescaler 60, because the state of a phase MUX 42 or 46 after a rotation depends on the state before the rotation. To equalize usage of the paths through the prescaler 60, the scrambler 114 tracks the actual states of the phase MUXes 42 and 46, rather than the rotations requested by the DSM 70. In one embodiment, the phase MUX states in the prescaler 60 are treated as a 4×4 array of 16 prescaler states, established by the input number selected in the first phase MUX 42 correlated with the input number selected in the second phase MUX 46, as illustrated in Table 2 below. For example, if the fourth input 82 is selected in the phase MUX 42 and the first input 120 is selected in the second phase MUX 46, the prescaler 60 may be said to be in state 13 given the prescaler state mapping of Table 2. (Note that for purposes of this discussion, MUX inputs are numbered 0-3, so when the first input 76 is selected in the phase MUX 42, it is in state 0.)

TABLE 2

| Prescaler state | MUX 42 input | MUX 46 input |
|---|---|---|
| 1 | 0 | 0 |
| 2 | 0 | 1 |
| 3 | 0 | 2 |
| 4 | 0 | 3 |
| 5 | 1 | 0 |
| 6 | 1 | 1 |
| 7 | 1 | 2 |
| 8 | 1 | 3 |
| 9 | 2 | 0 |
| 10 | 2 | 1 |
| 11 | 2 | 2 |
| 12 | 2 | 3 |
| 13 | 3 | 0 |
| 14 | 3 | 1 |
| 15 | 3 | 2 |
| 16 | 3 | 3 |

Note that the prescaler states assigned to particular input settings on MUXes 42 and 46 in Table 2 are merely examples, and the mapping may be adapted as desired. For example, redundant states may be placed adjacent one another in the map if desired, such as if it simplifies the replacement of one redundant state with the other by the scrambler 114. In other embodiments, the MUX states may be tracked in other ways rather than using an array of states. In some embodiments, the usage of each of the phase MUXes 42 and 46 is tracked independently rather than combining the states as in Table 2.

Each time the prescaler 60 ends in a new state, the scrambler 114 keeps track of the usage of that state. When the phase rotation control words 104 from the DSM 70 select a phase rotation that can be achieved by several redundant states, the scrambler 114 selects the redundant state that has been used less and generates scrambled phase rotation control words 122 that cause the phase MUX controllers 110 and 112 to place the phase MUXes 42 and 46 in the less used redundant states.

The actual states for the phase MUXes 42 and 46 may be derived from the scrambled phase rotation control words 122 as the number of rotations for a phase MUX 42 or 46 added to the previous state of that phase MUX 42 or 46, modulo 4. For example, if phase MUX 42 is in state 0 and the DSM 70 and scrambler 114 request one rotation of phase MUX 42, it ends in state 1. If two rotations are then requested, phase MUX 42 ends in state 3. If two rotations are again requested, phase MUX 42 ends in state 1, or (3+2) mod 4=1. The same operation is performed for phase MUX 46, enabling the scrambler 114 to track state usage even though the DSM 70 specifies phase rotations, not phase MUX states.

Note that the scrambler 114 may be divided into functional blocks in any suitable manner, such as the dynamic element matcher 130 (which determines the rotations to be performed in each MUX 42 and 46 based on the total rotations requested by the DSM 70) and MUX usage accumulator 132 (which tracks and equalizes MUX state usage) illustrated in the embodiment of FIG. 2, or in any other manner to perform the scrambling described herein.

Figure 3:
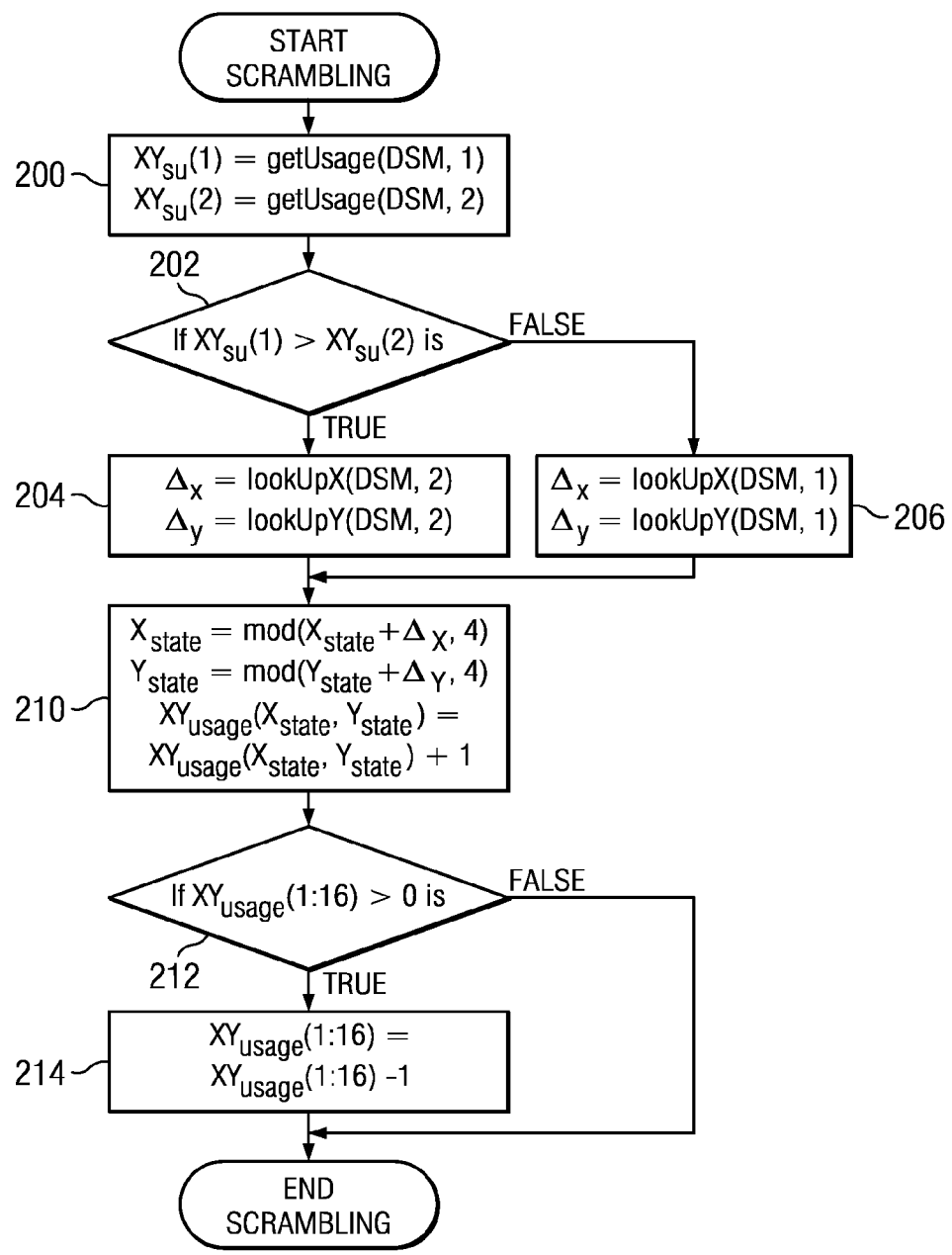
FIG. 3 depicts a flowchart of an operation for prescaler scrambling in a delta sigma modulated fractional-N frequency divider in accordance with some embodiments of the present invention.

Turning now to FIG. 3, a flowchart of the prescaler scrambling in accordance with some embodiments will be described. In block 200, the scrambler 114 looks up the state usage for both alternative phase MUX settings ($XY_{SU}(1)$ and $XY_{SU}(2)$, where X refers to phase MUX 42 and Y refers to phase MUX 46) given the current phase rotation control words 104 from the DSM 70, and where DSM in blocks 200, 204 and 206 represents the output of the DSM 70. (Note that if no redundant states are available for the requested phase rotation, elements of the flowchart of FIG. 3 are not applicable, such as looking up and comparing redundant state usage.) In block 202, the state usage values for the alternative phase MUX settings are compared. If alternative 1 has been used more than alternative 2, alternative 2 is chosen (block 204), otherwise, alternative 1 is chosen (block 206). The phase rotation for the MUX 42 ($\Delta_X$) and for phase MUX 46 ($\Delta_Y$) is looked up, calculated or otherwise obtained using the value of the phase rotation control words 104 from the DSM 70 and an indication of which alternative is to be used.

The state of phase MUX 42 ($X_{STATE}$) and of phase MUX 46 ($Y_{STATE}$) is calculated in block 210. As described above, these may be calculated as the phase rotation added to the previous state, modulo 4. The usage of the resulting prescaler state ($XY_{USAGE}(X_{STATE}, Y_{STATE})$) is also tracked in block 210, where $XY_{USAGE}$ is the prescaler state, ranging from 1 to 16 in this example, with the resulting phase MUX states ($X_{STATE}$, $Y_{STATE}$) acting as an index to the prescaler state usage array. Because the relative prescaler state usage is used in block 202, the total prescaler state usage is not needed. To simplify the scrambler 114 and reduce storage requirements, if every prescaler state from 1 to 16 has been used at least once, each member of the array may be decremented as illustrated in blocks 212 and 214. In some embodiments, the maximum value for each member of the prescaler state usage array is limited and is only incremented in block 210 if it has not already reached the limit, thereby limiting the number of bits that must be stored. The lookup performed by the scrambler 114 in blocks 204 and 206 retrieves $XY_{USAGE}$ values calculated in blocks 210, 212 and 214. Thus, the scrambler 114 tracks the actual phase MUX states in order to enable tracking of state usage, then uses comparisons of state usage for redundant states to determine the phase rotation to be applied to the phase MUXes 42 and 46 via the scrambled phase rotation control words 122.

The prescaler scrambling described above equalizes usage of redundant paths in the prescaler 60, significantly reducing the phase noise for a given division ratio. However, in some embodiments, the DSM 70 (and scrambler 114) may still preferentially weight certain paths through the prescaler 60 for some DSM output values. If the output of the DSM 70 is odd, the phase MUX 42 will either stand still or jump between two of its four states, preferentially weighting usage of the stage group containing those two states. If it is even, the same phase MUX 42 will change stage group and traverse through all its states. Thus the usage of odd and even state groups in the phase MUX 42 may not be balanced unless the DSM output value is manipulated. For example, when scrambling and selecting between redundant states, phase MUX 42 may have either input zero 76 or input two 220 selected depending on whether an extra rotation is used on phase MUX 46. Phase MUX 42 may also have either input one 80 or input three 82 selected depending on whether an extra rotation is used on phase MUX 46. Applying an even rotation change to phase MUX 42 when switching between redundant states will leave it in the same state group, either in the odd inputs 80 and 82 or the even inputs 76 and 220. (The term "state group" is used herein to refer to a group including a number of phase MUX input states. Some embodiments use an odd state group which includes odd numbered phase MUX inputs and an even state group which includes even numbered phase MUX inputs. Again, the phase MUX state is determined by the previous state and the rotation or delta shift specified by the DSM output.)

When the DSM 70 applies an odd rotation to phase MUX 42, the phase MUX 42 will change state groups, moving from the odd inputs 80 or 82 to the even inputs 76 or 220 or vice versa. However, when the DSM 70 applies an even rotation to phase MUX 42, the phase MUX 42 will stay in the same state group, remaining either in the odd inputs 80 or 82 or the even inputs 76 or 220, and as described above, some embodiments of the scrambler 114 do not remedy this unequal usage. In other words, the phase MUXes 42 and 46 in some embodiments do not have redundant states that include both odd and even state groups for phase MUX 42.

Figure 4:
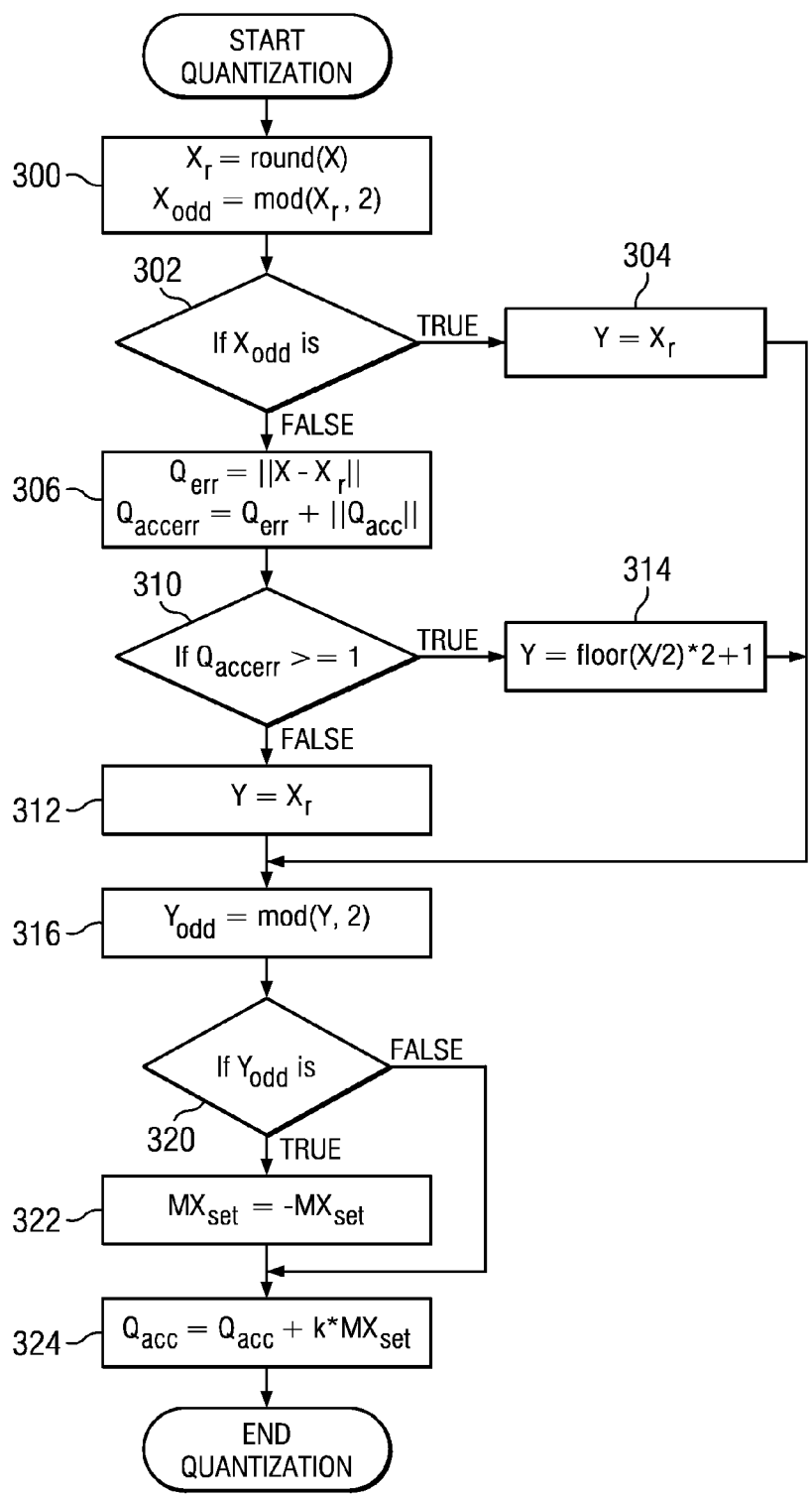
FIG. 4 depicts a flowchart of an operation for quantization in a delta sigma modulator to assist with prescaler scrambling.

Turning now to FIG. 4, in some embodiments the quantization in the DSM 70 is adapted to equalize usage between odd and even states in phase MUX 42. In short, the DSM 70 is adapted to keep track of whether phase MUX 42 is in an odd or even state, counts the number of times it has spent in each state, and if one is overused the DSM output is forced to be odd if the added quantization error is acceptable. Before describing the method of quantization in the DSM 70 to equalize usage between odd and even states, several of the variables presented in the flowchart of FIG. 4 are defined below:

X: Input to quantizer, based on fractional divisor 102 to the DSM 70

$X_R$: Rounded quantizer input

Figure 5:
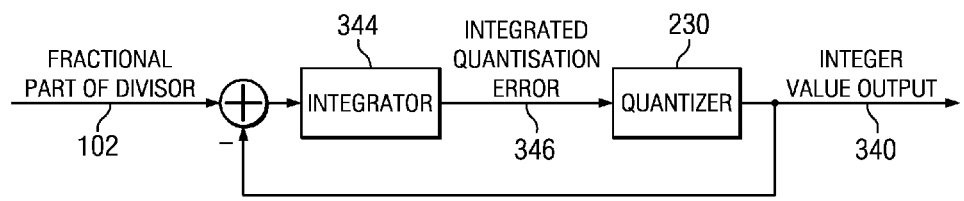
FIG. 5 depicts a block diagram of portions of a delta sigma modulator, including a quantizer.

Y: Output value from DSM 70, specifies overall number of rotations to be performed in phase MUX 42 and phase MUX 46 during one sub-period $X_{ODD}$: Indication of whether $X_R$ is odd or even $Q_{ERR}$: Quantization error, difference between requested fractional divisor X 102 and rounded fractional divisor $X_R$ $Q_{ACC}$: Accumulated MUX state group usage, tracks overusage of either MUX state group $Q_{ACCERR}$: Sum of quantization error $Q_{ACC}$ and accumulated MUX state group usage $Y_{ODD}$: Indication of whether Y is odd or even $MX_{SET}$: Indication of which state group MUXes currently use K: Weighting factor The quantizer 230 in the DSM 70 selects a rotation value to most closely provide the requested fractional divisor 102 over time, in effect rounding from the exact rotation value (which may be a fractional value) to an available integer rotation value. As illustrated in FIG. 5, the quantizer 230 produces an integer value output 340 based on the fractional divisor 102. Again, a simplified explanation of the DSM 70, neglecting noise shaping and other functions, is that it receives a fractional value as input, rounds it to an integer value, and modulates the output integer value so that it averages to the fractional input value. An integrator or loop filter 344 (not to be confused with a synth loop filter) keeps track of the integrated quantization error 346, the quantizer 230 rounds the integrated quantization error 346 to the nearest integer to produce an integer value output 340, and the integer value output 340 is subtracted from the fractional divisor 102 at the input to the integrator 344 to make sure the remaining integrated value corresponds to the remaining quantization error. The integer value output 340 may be used directly to produce the phase rotation control words 104 in the DSM 70, or it may be further manipulated to shape the quantization noise.

As illustrated in FIG. 4, some embodiments of the fractional-N divider with prescaler scrambling 32 track and manipulate odd and even DSM output values in order to equalize usage of odd and even states in phase MUX 42. Again, when the DSM 70 outputs an even value the phase MUX 42 will either stay in the previous state or toggle between two states, given a MUX with a total of four possible states. If the DSM 70 outputs an odd value the phase MUX 42 will jump to a different state than the previous one and over time all states will be used equally much. The DSM 70 is therefore forced at times to output the nearest odd value rather than the even value that would otherwise be called for by the quantizer 230, increasing the likelihood of resolving the state at the cost of slightly increased quantization noise. Forcing the quantizer 230 in the DSM 70 to output an odd value is equivalent to adding an error before the quantizer 230. Since the error is added in the DSM loop it will be noise shaped and thus most of the energy is moved to high frequencies that fall out-of-band.

The quantizer 230 calculates a quantized or rounded input value $X_R$ by rounding the quantizer input X 346 to the nearest integer. The quantizer 230 also determines whether the rotation value $X_R$ is odd or even using a calculation such as $X_{ODD}=\mod(X_R, 2)$. (Block 300) If $X_R$ is odd, as determined in block 302, the output value Y from the DSM 70 is set to the quantized input value $X_R$. (Block 304) If $X_R$ is even, as determined in block 302, the quantization error $Q_{ERR}$ is calculated by taking the magnitude or absolute value of the input value X minus the quantized input value $X_R$. The sum of the quantization error $Q_{ERR}$ and the absolute value of an accumulated MUX state group usage $Q_{ACC}$ is calculated, providing a variable $Q_{ACCERR}$ that helps determine whether to force an odd output from the DSM 70 rather than an even output. (Block 306) $Q_{ACCERR}$ is evaluated to determine whether it is greater than or equal to 1 to decide whether to change the output value Y from the DSM 70. (Block 310) Note that the threshold of 1 in block 310 is merely an example and the DSM 70 may be adapted as desired to other threshold values or other methods of balancing quantization error with phase noise and deciding when to change the output of the DSM 70.

The accumulated MUX state group usage $Q_{ACC}$ accumulates positively for odd states and negatively for even states, so if the odd and even state usage has been substantially balanced, the magnitude of $Q_{ACC}$ will be close to 0. If one state group is favored over the other, the magnitude of $Q_{ACC}$ will increase. By adding the quantization error $Q_{ERR}$ with the magnitude of the accumulated MUX state group usage $Q_{ACC}$ and changing the output value from the DSM 70 if the result reaches a threshold, the DSM 70 balances the quantization error that is added when the output value is moved further from the fractional divisor 102 against the phase noise that occurs when certain paths through the prescaler 60 are favored. If the quantization error $Q_{ERR}$ is relatively large, the DSM 70 is more likely to change the output value. If the quantization error $Q_{ERR}$ is relatively small, meaning that the quantized input value $X_R$ is very close to the desired value, the DSM 70 is less likely to change the output value. The longer one state group is favored over the other, the greater the magnitude of the accumulated MUX state group usage $Q_{ACC}$ and the more likely the DSM 70 is to change the output value. This reduces the noise added by changing quantizer values, staying with quantized values when the quantization error is small and waiting until the quantization error is larger or until a state group has been favored too long before changing the quantizer value at the output of the DSM 70.

As long as $Q_{ACCERR}$ is below a threshold value, for example less than 1, as determined in block 310, the output value Y is set to the quantized input value $X_R$, which is the nearest integer and is always even because of the branch in block 302. (Block 312) When $Q_{ACCERR}$ reaches or exceeds the threshold value, for example 1 or greater, as determined in block 310, the output value Y is set to the nearest odd integer, using a calculation such as Y=floor(X/2)*2+1. (Block 314)

The state group usage is tracked by determining if the output Y of the DSM 70 is odd, for example using a calculation such as $Y_{ODD}$=mod(Y, 2). (Block 316) If output Y is determined to be odd (block 320), then the state group used in the prescaler 60 will be changed and the value of $MX_{SET}$, the indication of which state group the MUXes 42 and 46 currently use, is swapped or toggled between −1 and 1. (Block 322) If output Y is determined to be even (block 320), then the state group will not change as discussed above, and $MX_{SET}$ is left unchanged. In one embodiment, $Q_{ACC}$ accumulates positively for odd states and negatively for even states, by setting $MX_{SET}$ to 1 when in an odd state and to −1 when in an even state. However, this convention of positive for odd states and negative for even states is arbitrary and may be switched if desired. The toggling of $MX_{SET}$ between −1 and 1 may be accomplished in any of a number of suitable manners, such as with an expression based on a modulo function such as 2*mod($MX_{SET}$+1,2)−1, or by initializing $MX_{SET}$ to 1 or −1 and subsequently changing the sign, or by a lookup table, etc. $Q_{ACC}$ is updated by adding $MX_{SET}$ to the previous value of $Q_{ACC}$. In some embodiments, $MX_{SET}$ is scaled by a weighting factor K to minimize or optimize the time during which the output Y is forced to change. (Block 324) This weighting can also be accomplished by toggling between numbers other than −1 and 1.

In some embodiments, usage of state groups in the prescaler 60 is achieved by the exclusive use of odd output values from the DSM 70, forcing a change of state groups with each rotation, but at the cost of some increased quantization error.

The scrambling and the quantization adjustment described herein may be implemented in a fractional-N divider 32 in any of a number of suitable manners, including in hardware, firmware, software, or in combinations of these. The fractional-N divider with prescaler scrambling 32 and the quantization adjustment described herein reduces phase noise in a frequency synthesizer PLL 10 due to MUX mismatch.

In conclusion, the present invention provides novel systems, devices, methods and arrangements for a frequency synthesizer having a delta sigma modulated fractional-N frequency divider with prescaler scrambling. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus for frequency dividing a clock signal, the apparatus comprising:
   a plurality of multiplexers connected in series with the clock signal, each having a plurality of inputs of different phase delays;
   a delta sigma modulator connected to control inputs on the plurality of multiplexers, wherein the delta sigma modulator is configured to repeatedly select different ones of the pluralities of inputs of different phase delays in the plurality of multiplexers to change a divide ratio between the clock signal and an output of the plurality of multiplexers;
   a multiplexer usage accumulator connected to the delta sigma modulator to track state usage of the plurality of multiplexers; and
   a scrambler circuit connected between the delta sigma modulator and the control inputs on the plurality of multiplexers, wherein the scrambler circuit is adapted to control settings in the plurality of multiplexers based at least in part on the multiplexer usage accumulator.

2. The apparatus of claim 1, wherein the delta sigma modulator specifies a phase rotation to be applied to the clock signal by the plurality of multiplexers, and wherein the plurality of multiplexers comprise a plurality of redundant states for at least one value for the phase rotation.

3. The apparatus of claim 2, wherein the scrambler circuit is configured to select among the plurality of redundant states to achieve the specified phase rotation and to reduce imbalance in the state usage of the plurality of multiplexers.

4. The apparatus of claim 2, further comprising a plurality of phase multiplexer controllers, each connected between the delta sigma modulator and a corresponding one of the plurality of phase multiplexers, wherein the plurality of phase multiplexers are configured to convert the phase rotation to a multiplexer input selection for each of the plurality of phase multiplexers.

5. The apparatus of claim 1, further comprising a divider connected between a first multiplexer and a second multiplexer in the plurality of multiplexers.

6. The apparatus of claim 1, wherein the multiplexer usage accumulator is located in the scrambler circuit.

7. The apparatus of claim 1, wherein the delta sigma modulator is configured to balance usage of odd and even state groups in the plurality of multiplexers, wherein the odd state group comprises selection of odd numbered inputs in at least one of the plurality of multiplexers, and wherein the even state group comprises selection of even numbered inputs in at least one of the plurality of multiplexers.

8. The apparatus of claim 7, wherein the delta sigma modulator is configured to select an underused state group by specifying an odd value phase rotation to be applied to the clock signal by the plurality of multiplexers, wherein the odd value phase rotation is selected to minimize quantization noise.

9. A method for dividing a frequency of a clock signal, the method comprising:
   generating a phase rotation signal in a delta sigma modulator to control a phase rotation in a plurality of phase multiplexers in a fractional-N divider prescaler;
   tracking usage of a plurality of states in each of the plurality of phase multiplexers; and
   selecting between redundant states in the plurality of states to achieve the phase rotation corresponding to the phase rotation signal, wherein the selection reduces imbalance in the usage of the plurality of states.

10. The method of claim 9, wherein the selecting comprises looking up a usage value for each of the redundant states available to achieve the phase rotation corresponding to the phase rotation signal, and selecting the redundant state having a lower usage value.

11. The method of claim 9, further comprising tracking a current state of each of the plurality of phase multiplexers.

12. The method of claim 11, wherein tracking the current states comprises storing an indication of which of a plurality of inputs is selected for each of the plurality of phase multiplexers.

13. The method of claim 12, wherein the indication of which of a plurality of inputs is selected comprises a sum of the phase rotation and a previous selected multiplexer input number, modulo a number of inputs in the phase multiplexer for which the indication is calculated.

14. The method of claim 9, further comprising dividing a clock signal between a first phase multiplexer and a second phase multiplexer of the plurality of phase multiplexers.

15. The method of claim 9, further comprising:
   tracking a usage of state groups in the plurality of multiplexers; and
   manipulating an output of a quantizer in the delta sigma modulator to reduce the imbalance in the usage of the plurality of states.

16. The method of claim 15, wherein tracking the usage of state groups comprises changing a state group indicator between a first value and a second value when the output of the quantizer will change state groups used in the plurality of multiplexers.

17. The method of claim 15, wherein the manipulating comprises changing the output of the quantizer to a value that will change the state group used in the plurality of multiplexers.

18. The method of claim 17, wherein the manipulating further comprises changing the output of the quantizer from an even value to an odd value, wherein the odd value is selected to minimize quantization noise.

19. The method of claim 18, wherein a likelihood of changing the output of the quantizer is inversely proportional to a quantizer error and proportional to an imbalance between the usage of the state groups.

20. An apparatus for frequency dividing a clock signal, the apparatus comprising:
   a plurality of multiplexers connected in series with the clock signal, each having a plurality of inputs of different phase delays;
   a delta sigma modulator connected to control inputs on the plurality of multiplexers, wherein the delta sigma modulator is configured to repeatedly select different ones of the pluralities of inputs of different phase delays in the plurality of multiplexers to change a divide ratio between the clock signal and an output of the plurality of multiplexers;
   a multiplexer usage accumulator connected to the delta sigma modulator to track state usage of the plurality of multiplexers;
   a scrambler circuit connected between the delta sigma modulator and the control inputs on the plurality of multiplexers, wherein the scrambler circuit is configured to control settings in the plurality of multiplexers based at least in part on the multiplexer usage accumulator;
   a divider connected between a first multiplexer and a second multiplexer in the plurality of multiplexers; and
   wherein the delta sigma modulator is configured to balance state usage in the plurality of multiplexers by monitoring state group usage and by changing an output of a quantizer in the delta sigma modulator from an even value closest to an input to the delta sigma modulator to an odd value closest to the even value.

* * * * *